United States Patent
Moriyama et al.

(10) Patent No.: US 8,309,381 B2
(45) Date of Patent: Nov. 13, 2012

(54) GROUP III NITRIDE SEMICONDUCTOR LIGHT-EMITTING DEVICE AND PRODUCTION METHOD THEREFOR

(75) Inventors: Miki Moriyama, Aichi (JP); Koichi Goshonoo, Aichi (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 413 days.

(21) Appl. No.: 12/585,994

(22) Filed: Sep. 30, 2009

(65) Prior Publication Data

US 2010/0078672 A1    Apr. 1, 2010

(30) Foreign Application Priority Data

Sep. 30, 2008    (JP) .................. 2008-254287

(51) Int. Cl.
*H01L 33/00* (2010.01)
*H01L 21/306* (2006.01)

(52) U.S. Cl. .................. 438/42; 257/103; 257/E33.023; 257/E21.219

(58) Field of Classification Search .............. 407/42; 438/42

See application file for complete search history.

(56) References Cited

U.S. PATENT DOCUMENTS

| 3,959,038 A * | 5/1976 | Gutierrez et al. | 257/10 |
| 5,773,369 A * | 6/1998 | Hu et al. | 438/746 |
| 6,060,402 A * | 5/2000 | Hanson | 438/745 |
| 6,614,821 B1 * | 9/2003 | Jikutani et al. | 372/43.01 |
| 2003/0116774 A1 * | 6/2003 | Yamamoto et al. | 257/94 |
| 2006/0255341 A1 * | 11/2006 | Pinnington et al. | 257/79 |

FOREIGN PATENT DOCUMENTS

| JP | 2002-280674 A | 9/2002 |
| JP | 2002-353144 A | 12/2002 |
| JP | 2003-229645 A | 8/2003 |
| JP | 2004-55854 A | 2/2004 |
| JP | 2007-235122 A | 9/2007 |
| JP | 2008-227540 A | 9/2008 |

OTHER PUBLICATIONS

Trichas et al., Selective photochemical etching of GaN films and laser lift-off for microcavity fabrication, Sep. 18, 2008, phys. stat. sol. (a) 205, No. 11, 2509-2512.*

Japanese Office Action dated May 8, 2012 with a partial English translation.

* cited by examiner

*Primary Examiner* — Matthew W Such
*Assistant Examiner* — Robert Carpenter
(74) *Attorney, Agent, or Firm* — McGinn IP Law Group, PLLC

(57) ABSTRACT

A method for producing a light-emitting device including a growth substrate made of Group III nitride semiconductor, and a Group III nitride semiconductor layer stacked on the top surface of the growth substrate, includes forming, between the growth substrate and the semiconductor layer, a stopper layer exhibiting resistance to a wet etchant, and wet-etching the bottom surface of the growth substrate until the stopper layer is exposed.

2 Claims, 3 Drawing Sheets

GROUP III NITRIDE SEMICONDUCTOR LIGHT-EMITTING DEVICE AND PRODUCTION METHOD THEREFOR

BACKGROUND OF THE INVENTION

1. Field of the Invention

The present invention relates to a Group III nitride semiconductor light-emitting device including a growth substrate formed of a Group III nitride semiconductor, and to a method for producing the light-emitting device. More particularly, the present invention relates to a light-emitting device in which the etching depth of a growth substrate is appropriately controlled, and to a method for producing the light-emitting device.

2. Background Art

Hitherto, there have been known methods for producing Group III nitride semiconductor light-emitting devices in which a GaN substrate is used as a growth substrate for improving the crystallinity of a semiconductor layer. In such a light-emitting device, desirably, the bottom surface of the GaN substrate is processed, since light extraction performance can be enhanced, and light distribution can be improved.

Photo-enhanced chemical reaction (PEC) etching is a known technique for wet etching of GaN. In this technique, while being immersed in an etchant, GaN is irradiated with light having a wavelength corresponding to an energy higher than the band gap energy (hereinafter may be referred to simply as "band gap") of GaN, to thereby increase the etching rate of GaN.

Japanese Patent Application Laid-Open (kokai) No. 2004-55854 discloses a Group III nitride semiconductor laser including a substrate having a membrane structure in which cavities have been formed. However, this patent document does not specifically describe how to form cavities in a substrate. In the membrane structure, cavities assuming a truncated conical shape or a columnar shape are provided at a center portion of the substrate, with a peripheral portion of the substrate remaining intact; the bottom surface of each cavity is parallel to the substrate surface; and the side surface of each cavity is perpendicular to the substrate surface or is tapered surfaces inclined with respect to the substrate surface.

Processing of the bottom surface of a GaN substrate for forming such cavities may be carried out through mechanical polishing or dry etching. However, since such a technique is not suited for mass production, wet etching may be employed as an alternative technique for processing of the bottom surface of a GaN substrate.

However, when wet etching is employed for processing of a GaN substrate, difficulty is encountered in controlling etching depth, and shape reproducibility of the processing is unsatisfactory.

SUMMARY OF THE INVENTION

In view of the foregoing, an object of the present invention is to provide a light-emitting device including a GaN substrate which has been etched to an appropriate depth. Another object of the present invention is to provide a method for producing the light-emitting device.

In a first aspect of the present invention, there is provided a light-emitting device comprising:

a growth substrate made of a Group III nitride semiconductor;

a Group III nitride semiconductor layer stacked on the top surface of the growth substrate;

a support substrate joined to the semiconductor layer on the side opposite the growth substrate side of the semiconductor layer; and a stopper layer formed between the growth substrate and the semiconductor layer, the stopper layer being formed of a material having a band gap higher than that of the material of the growth substrate, wherein the growth substrate has, at a center portion of the bottom surface, a cavity having a side surface perpendicular to or inclined with respect to the top or bottom surface of the growth substrate, so that the stopper layer or the semiconductor layer is exposed to the space defined by the cavity.

As used herein, "Group III nitride semiconductor" refers to a semiconductor represented by the formula $Al_xGa_yIn_{1-x-y}N$ ($0 \leq x \leq 1, 0 \leq y \leq 1, 0 \leq x+y \leq 1$), such as GaN, AlGaN, InGaN, or AlGaInN. The n-type impurity employed may be, for example, Si, and the p-type impurity employed may be, for example, Mg.

The growth substrate employed may be a substrate whose main surface has a specific crystal orientation, such as a c-plane substrate, an m-plane substrate, an a-plane substrate, or an r-plane substrate. When the growth substrate is a c-plane substrate, preferably, the surface on which the stopper layer is formed (i.e., the top surface of the growth substrate, or the surface of the semiconductor layer facing the growth substrate) is a Ga-polar surface. That is, the surface which undergoes etching is an N-polar surface. This is because, as compared with an N-polar surface, a Ga-polar surface is less likely to be etched.

No particular limitation is imposed on the material of the stopper layer, so long as the material has a band gap higher than that of the material of the growth substrate. When the stopper layer is formed of a Group III nitride semiconductor, the band gap thereof may be regulated by varying the compositional proportion(s) of the Group III element(s) of the semiconductor. Preferably, the stopper layer is formed of a material having a lattice constant nearly equal to that of the material of the growth substrate, since the semiconductor layer formed on the stopper layer exhibits good crystallinity.

A second aspect of the present invention is drawn to a specific embodiment of the light-emitting device according to the first aspect, wherein the stopper layer is exposed to the space defined by the cavity.

A third aspect of the present invention is drawn to a specific embodiment of the light-emitting device according to the first or second aspect, wherein the stopper layer is formed of a Group III nitride semiconductor.

A fourth aspect of the present invention is drawn to a specific embodiment of the light-emitting device according to the third aspect, wherein the stopper layer is formed of AlGaN.

A fifth aspect of the present invention is drawn to a specific embodiment of the light-emitting device according to the fourth aspect, wherein the stopper layer has an Al compositional proportion of 5 to 40%.

When the Al compositional proportion of the stopper layer is less than 5%, difficulty is encountered in selectively etching only the growth substrate, which is not preferred, whereas when the Al compositional proportion of the stopper layer exceeds 40%, the crystallinity of the stopper layer is impaired, and thus a problem arises in terms of quality of the semiconductor layer formed on the stopper layer, which is not preferred. The Al compositional proportion of the stopper layer is more preferably 20 to 30%.

A sixth aspect of the present invention is drawn to a specific embodiment of the light-emitting device according to any one of the first to the fifth aspects, wherein the growth substrate is formed of GaN.

A seventh aspect of the present invention is drawn to a specific embodiment of the light-emitting device according to any one of the first to the sixth aspects, wherein the growth substrate is a c-plane substrate, and the top surface and the bottom surface of the substrate are a Ga-polar surface and an N-polar surface, respectively.

In an eighth aspect of the present invention, there is provided a method for producing a light-emitting device comprising a growth substrate made of Group III nitride semiconductor, and a Group III nitride semiconductor layer stacked on the top surface of the growth substrate, the method comprising:

forming, between the growth substrate and the semiconductor layer, a stopper layer exhibiting resistance to a wet etchant; and wet-etching the bottom surface of the growth substrate until the stopper layer is exposed.

In wet etching, a portion or the entirety of the growth substrate may be removed.

The etchant employed for wet etching is, for example, aqueous solution of potassium hydroxide, sodium hydroxide, or the like, or phosphoric acid.

A ninth aspect of the present invention is drawn to a specific embodiment of the production method according to the eighth aspect, wherein the stopper layer is formed of a material having a band gap higher than that of the material of the growth substrate, and the wet-etching is PEC etching employing light having a wavelength corresponding to an energy higher than the band gap of the material of the substrate, but lower than the band gap of the material of the stopper layer.

A tenth aspect of the present invention is drawn to a specific embodiment of the production method according to the eighth or ninth aspect, wherein the stopper layer is formed of a Group III nitride semiconductor.

An eleventh aspect of the present invention is drawn to a specific embodiment of the production method according to the tenth aspect, wherein the stopper layer is formed of AlGaN.

A twelfth aspect of the present invention is drawn to a specific embodiment of the production method according to the eleventh aspect, wherein the stopper layer has an Al compositional proportion of 5 to 40%.

A thirteenth aspect of the present invention is drawn to a specific embodiment of the production method according to any one of the eighth to twelfth aspects, wherein the growth substrate is formed of GaN.

A fourteenth aspect of the present invention is drawn to a specific embodiment of the production method according to any one of the eighth to thirteenth aspects, wherein the growth substrate is a c-plane substrate, and the top surface and the bottom surface of the substrate are a Ga-polar surface and an N-polar surface, respectively.

A fifteenth aspect of the present invention is drawn to a specific embodiment of the production method according to any one of the eighth to fourteenth aspects, wherein the wet etching is carried out for providing, at a center portion of the bottom surface of the growth substrate, a cavity having a side surface perpendicular to or inclined with respect to the top or bottom surface of the growth substrate, so that the stopper layer is exposed to the space defined by the cavity.

According to the first aspect of the present invention, since the growth substrate has a membrane structure; i.e., the substrate has a cavity having a side surface perpendicular to or inclined with respect to the top or bottom surface of the growth substrate, the light-emitting device exhibits a mechanical strength higher than that in the case where the growth substrate is completely removed. In the light-emitting device, since the stopper layer is formed, on the top surface of the growth substrate, from a material having a band gap higher than that of the material of the growth substrate, the growth substrate can be processed to have a membrane structure through PEC etching with high accuracy, and excellent shape reproducibility of the processing can be attained.

According to the eighth aspect of the present invention, since the stopper layer is formed between the growth substrate and the semiconductor layer, the bottom surface of the growth substrate can be processed with high accuracy. Particularly, according to the ninth aspect of the present invention, since PEC etching is carried out, the growth substrate can be processed with higher accuracy, and excellent shape reproducibility of the processing can be attained.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
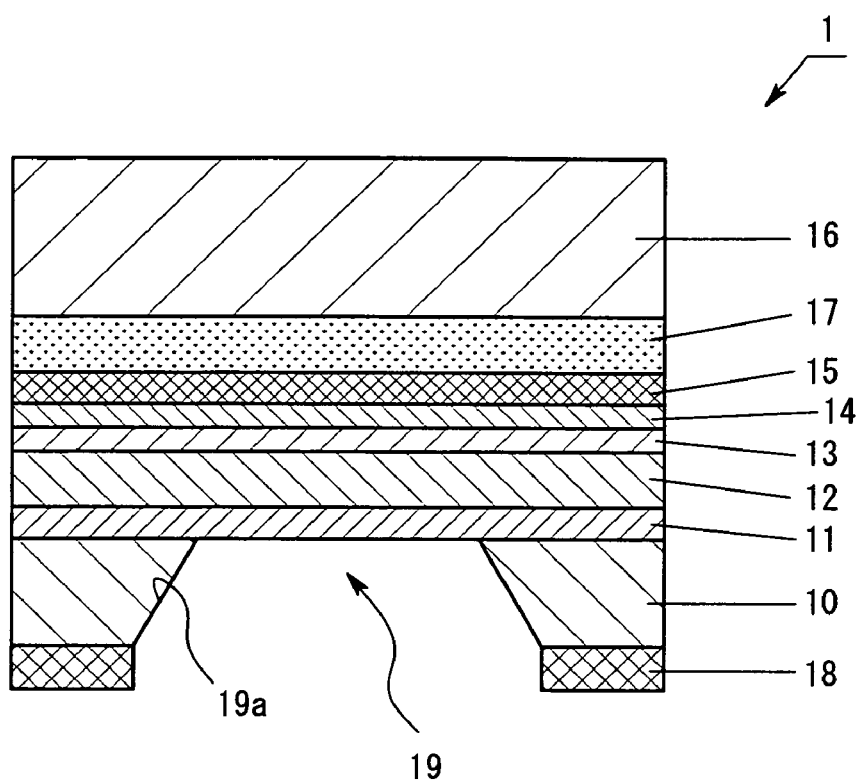
FIG. 1 shows the structure of a light-emitting device 1.

FIG. 1 shows the structure of a light-emitting device 1 according to Embodiment 1. The light-emitting device 1 has a structure including a GaN substrate 10; a stopper layer 11 formed on the top surface of the GaN substrate 10; an n-type layer 12, an active layer 13, and a p-type layer 14 which are sequentially stacked on the stopper layer 11; a p-electrode 15 formed on the p-type layer 14; a support substrate 16 joined, via a solder layer 17, to the p-electrode 15; and an n-electrode 18 formed on the bottom surface of the GaN substrate 10. The GaN substrate 10 corresponds to the growth substrate of the present invention, and the n-type layer 12, the active layer 13, or the p-type layer 14 corresponds to the semiconductor layer of the present invention.

The GaN substrate 10 is a c-plane substrate having a dislocation density of $1 \times 10^7/cm^2$ or less. The substrate surface on which the stopper layer 11 is formed is a Ga-polar surface, and the other substrate surface on which the n-electrode 18 is formed is an N-polar surface. The GaN substrate 10 has a membrane structure; i.e., the GaN substrate 10 has a cavity 19 having a depth from the bottom surface thereof to the stopper layer 11. In "the GaN substrate 10 has a membrane structure," a cavity 19 assuming a truncated conical shape or a columnar shape is provided at a center portion of the bottom surface of the GaN substrate 10, with a peripheral portion of the bottom surface of the GaN substrate 10 remaining intact. The cavity 19 has side surfaces 19a inclined by about 60° with respect to the bottom surface of the GaN substrate 10. By virtue of this membrane structure, the light-emitting device exhibits high mechanical resistance to, for example, torsion or deflection, as compared with the case of a light-emitting device having a thin structure produced through complete removal of the GaN substrate 10.

The stopper layer 11 is formed of Si-doped n-type AlGaN having an Al compositional proportion of 20%. The stopper layer 11 is provided for preventing variation in etching depth when the GaN substrate 10 is processed through PEC etching to have a membrane structure. Alternatively, the stopper layer 11 may be formed of Si-undoped n-type AlGaN.

The Al compositional proportion is not necessarily 20%, but is preferably 5 to 40%. When the Al compositional proportion is less than 5%, the difference in band gap between AlGaN and GaN becomes excessively small, and thus difficulty is encountered in selectively etching only the GaN substrate 10 through PEC etching, and variation in etching depth cannot be prevented. In contrast, when the Al compositional proportion exceeds 40%, the stopper layer 11 exhibits poor crystallinity, and a problem arises in terms of crystallinity of the semiconductor layers formed on the stopper layer 11 (i.e., the n-type layer 12, the active layer 13, and the p-type layer 14), which is not preferred.

The thickness of the stopper layer 11 can be reduced to a minimum possible level, so long as the stopper layer 11 exhibits satisfactory etching resistance. However, the thickness of the stopper layer 11 is preferably 200 to 500 nm. This is because, when the stopper layer 11 has a thickness of less than 200 nm, the layer 11 may be completely etched through PEC etching. In contrast, when the stopper layer 11 has a thickness greater than 500 nm, the layer 11 may adversely affect the n-type layer 12, the active layer 13, and the p-type layer 14, which is not preferred.

The n-type layer 12, the active layer 13, and the p-type layer 14 may have any conventionally known structure. The n-type layer 12 or the p-type layer 14 may have a single-layer structure or a multi-layer structure, or may include a superlattice layer. For example, the n-type layer 12 may be formed of an n-type contact layer and an n-type cladding layer, and the p-type layer 14 may be formed of a p-type cladding layer and a p-type contact layer. The active layer 13 may have, for example, an MQW or SQW structure.

The p-electrode 15 may be formed of a metallic material having high optical reflectance and low contact resistance (e.g., Ag, Rh, Pt, Ru, Al, or an alloy predominantly containing such a metal), or may be formed of, for example, Ni, an Ni alloy, or an Au alloy. Alternatively, the p-electrode 15 may be formed of a composite layer including a transparent electrode film (e.g., ITO) and a highly reflective metal film. For enhancement of reflectance, a DBR (distributed Bragg reflector) structure may be formed from, for example, ITO and $TiO_2$ between the p-type layer 14 and the p-electrode 15.

The support substrate 16 may be an electrically conductive substrate made of Si, GaAs, Cu, Cu—W, or a similar material. Alternatively, the support substrate 16 may be prepared by forming, for example, an electrode pattern on the surface of an insulating substrate.

The solder layer 17 may be formed of a eutectic alloy such as Au—Sn, Au—Si, Ag—Sn—Cu, or Sn—Bi. The semiconductor layer may be joined to the support substrate 16 by the mediation of gold bumps. Alternatively, the solder layer 17 may be replaced with a thick Au layer (thickness: 10 μm or more) formed by Au plating or Au paste, and the Au layer may be bonded to the support substrate 16.

Next will be described a method for producing the light-emitting device 1 according to Embodiment 1 with reference to FIGS. 2A to 2D.

Figure 2A:
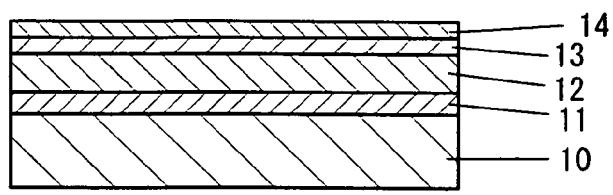
FIGS. 2A to 2D show a process for producing the light-emitting device 1.

Firstly, a stopper layer 11 is formed on the top surface (i.e., Ga-polar surface) of a GaN substrate 10, and an n-type layer 12, an active layer 13, and a p-type layer 14 are sequentially formed on the stopper layer 11 (FIG. 2A). These layers are formed through MOCVD. CVD sources employed for formation of these layers are as follows: TMG (trimethylgallium) serving as a Ga source, TMA (trimethylaluminum) serving as an Al source, trimethylindium serving as an In source, ammonia serving as an N source, silane serving as an Si source (i.e., n-type dopant), and $Cp_2Mg$ (bis(cyclopentadienyl)magnesium) serving as an Mg source (i.e., p-type dopant).

Figure 2B:
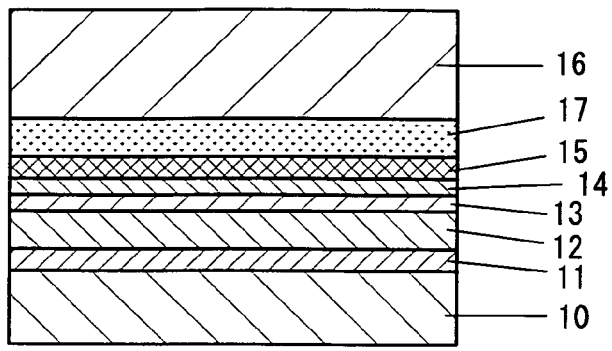

Subsequently, a p-electrode 15 is formed on the p-type layer 14 through vapor deposition, and then the p-electrode 15 is bonded to a support substrate 16 via a solder layer 17 (FIG. 2B).

Figure 2C:
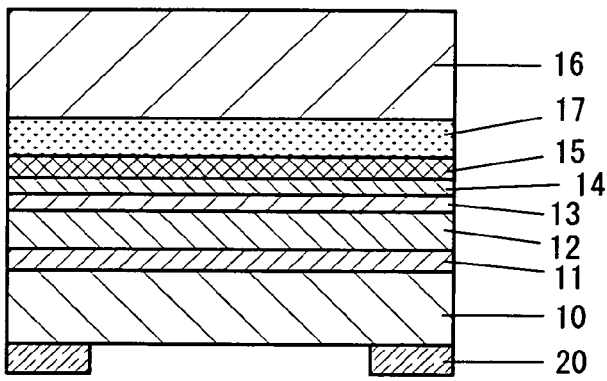

Thereafter, the bottom surface of the GaN substrate 10 is polished through mechanical polishing and CMP (chemical mechanical polishing), and an $SiO_2$ mask 20 is formed on the thus-polished bottom surface, followed by formation of a center-opening pattern (FIG. 2C). Polishing of the bottom surface of the GaN substrate 10 may be carried out in combination with dry etching. The mask 20 may be formed of a material (other than $SiO_2$) having resistance to wet etching; for example, a resist, TiN, Pt, or Ir.

Subsequently, the bottom surface of the GaN substrate 10 is subjected to PEC etching. The light employed in the etching has a wavelength corresponding to an energy higher than the band gap of GaN, but lower than the band gap of AlGaN having an Al compositional proportion of 20%. This etching employs an etchant such as KOH (potassium hydroxide), NaOH (sodium hydroxide), or phosphoric acid. When the support substrate 16 is formed of a material having no resistance to such an etchant, a protective film (e.g., resist film) is formed on the support substrate 16. In the case of irradiation with light having such a wavelength, since the light has an energy higher than the band gap of GaN, the etching rate of GaN increases. However, since the light has an energy lower than the band gap of AlGaN having an Al compositional proportion of 20%, the etching rate of AlGaN is very low. As a result, only GaN is selectively etched.

Figure 2D:
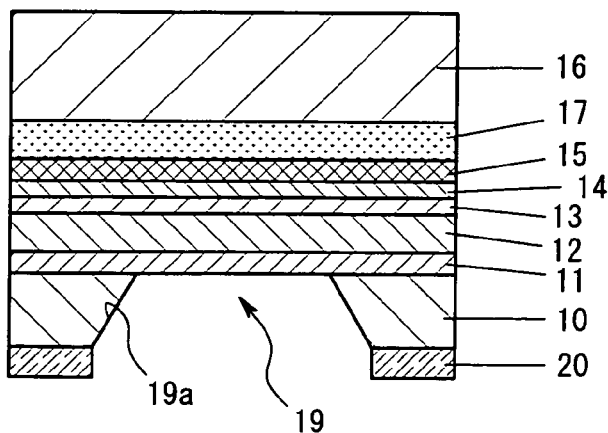

Thus, a portion of the GaN substrate 10 corresponding to a bottom surface region which is not covered with the mask 20 is gradually etched toward the top surface side of the GaN substrate 10. When etching proceeds to a depth reaching the stopper layer 11, etching almost stops at this depth. This etching forms a cavity 19 having a depth from the bottom surface of the GaN substrate 10 to the stopper layer 11, whereby a membrane structure is formed (FIG. 2D). Since wet etching of GaN exhibits anisotropy, the cavity 19 has tapered side surfaces 19a which are inclined by about 60° with respect to the bottom surface of the GaN substrate 10.

Before finishing with PEC etching, general wet etching may be carried out by use of, for example, hot phosphoric acid. Etching may be carried out under such conditions that micro-embossments are formed on etched surfaces (i.e., bottom and side surfaces of the cavity). Formation of such embossments can enhance light extraction performance. The n-type layer 13 may be exposed by, for example, allowing etching to proceed further.

Thereafter, the mask 20 is removed, and an n-electrode 18 is formed on the bottom surface of the GaN substrate 10, to thereby produce the light-emitting device 1 shown in FIG. 1.

The mask 20 may be formed of a metal exhibiting resistance to an etchant employed and low contact resistance to GaN, and may be employed, as is, as an electrode without being removed after the PEC etching step.

As described above, since the stopper layer 11—which is formed of AlGaN (i.e., a material having a band gap greater than that of GaN)—is provided on the top surface of the GaN substrate 10, PEC etching from the bottom surface of the GaN substrate 10 stops at the depth reaching the stopper layer 11. Therefore, the GaN substrate 10 can be processed to have a membrane structure at high reproducibility.

Embodiment 2

Figure 3:
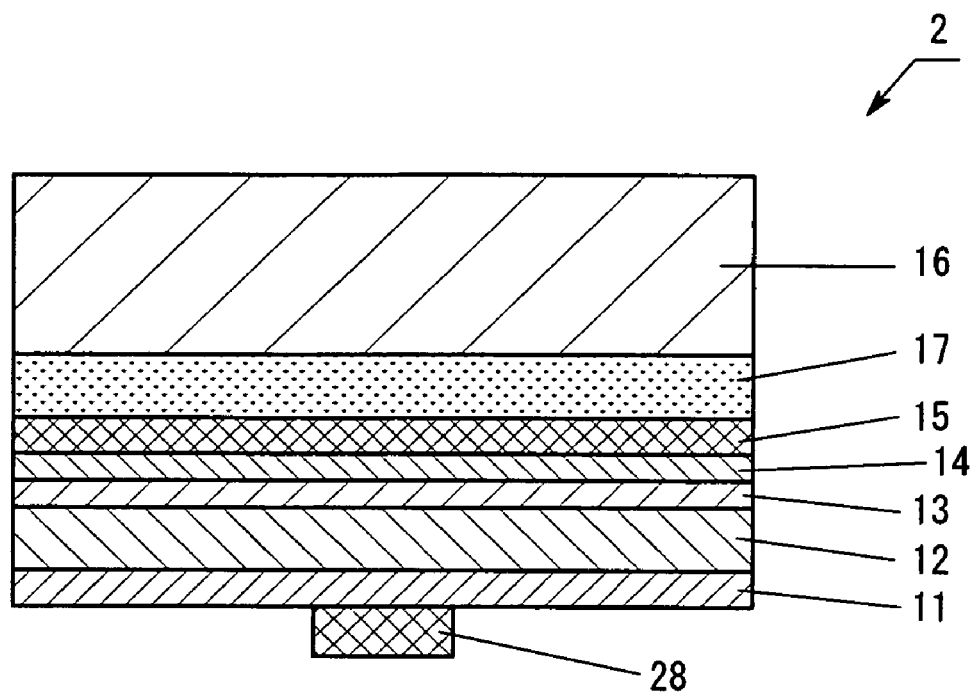
FIG. 3 shows the structure of a light-emitting device 2.

FIG. 3 shows the structure of a light-emitting device 2 according to Embodiment 2. The light-emitting device 2 has the same structure as the light-emitting device 1, except that a GaN substrate 10 has been completely removed, and an n-electrode 28 is formed on the bottom surface of a stopper layer 11. Specifically, the light-emitting device 2 includes the stopper layer 11; an n-type layer 12, an active layer 13, and a p-type layer 14 which are sequentially formed on the top surface of the stopper layer 11; a p-electrode 15 formed on the p-type layer 14; a support substrate 16 bonded, via a solder layer 17, to the p-electrode 15; and an n-electrode 28 formed on the bottom surface of the stopper layer 11. Components common to those of the light-emitting device 1 according to Embodiment 1 are denoted by the same reference numerals.

Next will be described a method for producing the light-emitting device 2. The light-emitting device 2 is produced in the same manner as in the light-emitting device 1 until the step shown in FIG. 2B. After the step shown in FIG. 2B, the entire bottom surface of the GaN substrate 10 is subjected to PEC etching without formation of a mask 20. As described above in Embodiment 1, this etching stops when the etching depth reaches the stopper layer 11. Through this etching step, the GaN substrate 10 is completely removed. Thereafter, an n-electrode 28 is formed on the bottom surface of the stopper layer 11 exposed through etching, to thereby produce the light-emitting device 2.

Thus, since the stopper layer 11 is formed, only the GaN substrate 10 is completely removed through PEC etching with high accuracy. In addition, such a substrate-removed structure can be reproduced with high accuracy.

Since the light-emitting device 2 has a structure obtained through complete removal of the GaN substrate 10 (i.e., growth substrate), the device 2 exhibits a mechanical strength lower than that of the light-emitting device 1. However, when, for example, the surface exposed through removal of the GaN substrate 10 is processed to have micro-embossment, the light-emitting device 2 becomes more advantageous than the light-emitting device 1 in terms of light extraction performance or light distribution.

A structure similar to that of the light-emitting device 2 may also be realized through the laser lift-off (LLO) process, in which a semiconductor layer is formed on a sapphire substrate, and the sapphire substrate is removed therefrom through laser irradiation. However, as compared with a structure produced through the LLO process, the light-emitting device 2 is advantageous in the following points. First, the light-emitting device 2, in which the GaN substrate is removed through wet etching, is less damaged (unlike the case of the structure obtained through removal of a sapphire substrate through the LLO process, which is damaged due to, for example, laser or physical impact), and the light-emitting device 2 exhibits low leakage current and high reliability, as compared with the structure produced through the LLO process. Second, the light-emitting device 2, in which semiconductor layers are epitaxially grown on the GaN substrate 10, has few dislocations and exhibits high internal quantum efficiency, as compared with the case where semiconductor layers are epitaxially grown on a sapphire substrate.

In each of the aforementioned embodiments, the growth substrate employed is a c-plane GaN substrate. However, in the present invention, no particular limitation is imposed on the growth substrate employed, so long as it is formed of a Group III nitride semiconductor. The growth substrate employed may be a Group III nitride semiconductor substrate whose main surface has a crystal orientation other than c-plane, such as an m-plane substrate, an a-plane substrate, or an r-plane substrate. When the growth substrate is a c-plane substrate, preferably, the surface which undergoes PEC etching is an N-polar surface. This is because, as compared with a Ga-polar surface, an N-polar surface is more easily etched.

In each of the embodiments, the stopper layer is formed of AlGaN. However, in the present invention, no particular limitation is imposed on the material of the stopper layer, so long as the material has a band gap greater than that of the material of the growth substrate. The stopper layer may be doped with an impurity, and the etching rate of the layer may be controlled by varying the type or amount of the impurity.

The light-emitting device according to each of the embodiments has a top and bottom electrode structure. However, the present invention is not limited to such a structure. For example, the present invention is also applicable to a flip-chip-type light-emitting device (i.e., a light-emitting device in which an n-electrode and a p-electrode are formed on the same surface side).

In Embodiment 1, the growth substrate is processed to have a membrane structure. However, the present invention is also applicable to a process for forming a structure other than a membrane structure.

In each of the aforementioned embodiments, the p-electrode is bonded to the support substrate. However, the present invention does not necessarily employ a support substrate.

The present invention is applicable to, for example, a display apparatus or an illumination apparatus.

What is claimed is:

1. A method for producing a light-emitting device comprising a growth substrate made of Group III nitride semiconductor, and a Group III nitride semiconductor layer stacked on the top surface of the growth substrate, the method comprising:
    forming, between the growth substrate and the semiconductor layer, a stopper layer exhibiting resistance to a wet etchant; and
    wet-etching the bottom surface of the growth substrate until the stopper layer is exposed,
    wherein the growth substrate comprises GaN,
    wherein the stopper layer comprises AlGaN including an Al compositional proportion in a range from 5% to 40% and including a band gap greater than a band gap of a material of the growth substrate,
    wherein the growth substrate comprises a c-plane substrate, and the top surface and the bottom surface of the substrate comprise a Ga-polar surface and an N-polar surface, respectively, and
    wherein the wet-etching of the bottom surface comprises photo-enhanced chemical reaction (PEC) etching employing light including a wavelength corresponding to an energy which is greater than a band gap of the material of the substrate, and less than a band gap of a material of the stopper layer.

2. A method for producing a light-emitting device according to claim 1, wherein the wet etching is carried out for providing, at a center portion of the bottom surface of the growth substrate, a cavity having a side surface perpendicular to or inclined with respect to the top or bottom surface of the growth substrate, so that the stopper layer is exposed to the space defined by the cavity.

* * * * *